United States Patent [19]
Maslakow

[11] Patent Number: 5,483,740
[45] Date of Patent: Jan. 16, 1996

[54] METHOD OF MAKING HOMOGENEOUS THERMOPLASTIC SEMI-CONDUCTOR CHIP CARRIER PACKAGE

[75] Inventor: William H. Maslakow, Lewisville, Tex.

[73] Assignee: AK Technology, Inc., Carrollton, Tex.

[21] Appl. No.: 345,573

[22] Filed: Nov. 28, 1994

Related U.S. Application Data

[62] Division of Ser. No. 250,153, May 26, 1994.

[51] Int. Cl.⁶ .................................................. H01R 43/00
[52] U.S. Cl. ........................ 29/827; 29/830; 257/666; 437/220; 174/52.2; 174/52.3; 174/52.4
[58] Field of Search ...................... 257/666; 437/220; 29/830; 174/52.2, 52.3, 52.4

[56] References Cited

U.S. PATENT DOCUMENTS 4,750,092  6/1988  Werther .
5,177,032  1/1993  Fogal et al. ......................... 257/666 X

FOREIGN PATENT DOCUMENTS 4-68542   3/1992  Japan ..................................... 437/220
4-72749   3/1992  Japan ..................................... 257/666
4-199661  7/1992  Japan ..................................... 257/666

*Primary Examiner*—Carl J. Arbes
*Attorney, Agent, or Firm*—Jenkens & Gilchrist

[57] ABSTRACT

A homogeneous thermoplastic semi-conductor chip carrier cavity package (HC package) which utilizes the same thermoplastic for various integral attachments to the HC package, such as, a molded lid and a circuit substrate. A chemical bonding or fusing of the integral attachments to the HC package provides increased protection from having moisture enter into the cavity of the HC package. The HC package eliminates problems which are associated with having different coefficients of thermal expansion for the HC package and its various integral attachments.

6 Claims, 2 Drawing Sheets

ND HOMOGENEOUS
METHOD OF MAKING HOMOGENEOUS THERMOPLASTIC SEMI-CONDUCTOR CHIP CARRIER PACKAGE

This application is a division of application No. 08/250,153, filed May 26, 1994.

BACKGROUND

1. Field of the Present Invention

The present invention relates generally to chip carrier packages for semi-conductor integrated circuit chips and, more particularly, to a homogeneous chip carrier package for semi-conductor integrated circuit chips.

2. Description of Related Art

In the electronic industry, it is conventional in the prior art to encapsulate semi-conductor devices such as integrated circuit chips in chip carrier packages. Chip carrier packages protect a chip from environmental hazards, and provide means for electrically and mechanically attaching the chip to an intended device. A primary focus in the design of a chip carrier package is to provide the chip with adequate protection from the external environment.

One prior art approach for designing a chip carrier package to provide adequate protection from the external environment is the total encasement chip carrier package (TE package). The TE package general includes a lead frame having a chip die mounting pad, an integrated circuit chip die which is attached to the chip die mounting pad, a plurality of fragile wires which connect the chip die to the lead frame, and a thermoset plastic which total encases the lead frame, the chip die and the plurality of fragile wires. The TE package has several problems which arise from the thermoset plastic's direct contact with the chip die and the plurality of fragile wires. First, the thermoset plastic's direct contact with the plurality of fragile wires, which connect the chip die to the lead frame. The molding process may cause a disruption of the planarity or spacing of the fragile wires, which can produce electrical shorting of the plurality of fragile wires, thus, resulting in chip failure or damage. Second, different coefficients of thermal expansion exist for the chip die, the lead frame, the plurality of fragile wires and the thermoset plastic. Materials having different coefficients of thermal expansion expand and contract at different rates during temperature variations. Temperature variations are produced during the molding process of the TE package, during final solder attachment of the TE package to the intended device board and during the operation of the chip within the TE package. The temperature variations provide the possibility for disassociation of the thermoset plastic from the chip die and the plurality of fragile wires. Disassociation of the thermoset plastic from the chip die and the plurality of fragile wires produces chip failure and/or damage resulting from wire stress failure or wire bond connection failure. The temperature variations further provide the possibility for the formation of voids. Third, the thermoset plastic utilized in the manufacture of the TE package exhibits hygroscopic properties. The hygroscopic properties of the TE package allow moisture to enter and accumulate in the formed voids. High temperatures are required during the final solder attachment of the TE package to the intended device. The high temperatures can convert the moisture, located within the formed voids, into steam, thereby expanding and cracking the TE package or the chip die.

Another prior art approach for designing a chip carrier package to provide adequate protection from the external environment is a cavity package. The cavity package generally includes a lead frame having a plurality of lead members and a chip die mounting pad, an integrated circuit chip die attached to the chip die mounting pad, a plurality of fragile wires which connect the chip die to the plurality of lead members, a thermoset plastic which is formed around the lead frame and the chip die mounting pad in such a manner as to provide a cavity, and a thermoset molded lid which is attached to the cavity by a thermoset adhesive. The cavity package has several problems associated with its manufacture. First, some of the plurality of lead members have their planarity compromised during the process of molding or injecting the thermoset plastic around the lead frame and the chip die mounting pad. Each one of the plurality of lead members which has its planarity compromised increases the difficulty in connecting an associated fragile wire from the chip die to the compromised lead member. Second, during the molding or injecting process, the chip die mounting pad and the plurality of lead members may also be partially, or in some cases, totally, covered with the thermoset plastic material, causing extensive cleaning steps to remove the thermoset plastic material prior to connecting the plurality of fragile wires. Molding apparatus systems have been designed to address certain of these issues. However, the molding apparatus systems are expensive and require costly maintenance. Third, the thermoset plastic which is utilized in the manufacture of the cavity package exhibits hygroscopic properties. The hygroscopic properties of the thermoset plastic allow moisture to enter the cavity. Chemical leaching is produced from the contact of the moisture with the thermoset plastic within the cavity. Leached chemicals, within the cavity, can be in contact with the plurality of fragile wires and/or chip die. The leached chemicals can result in the shorting of the plurality of fragile wires, thus, producing chip failure. High temperatures are generated within the cavity during the process of attaching the cavity package to an intended device and during the operation of the chip. The generated high temperatures convert moisture within the cavity to steam, thereby expanding and cracking the thermoset molded lid and/or damage to the chip.

A further approach by the prior art for designing a chip carrier package to provide adequate protection from the external environment is a substrate cavity package. A substrate cavity package (SC package) generally includes a laminated thermoset circuit substrate having an etched chip die mounting pad and a plurality of etched inner lead traces, a lead frame having a plurality of lead members which are soldered to the plurality of etched inner lead traces, an integrated circuit chip die attached to the chip die mounting pad, a plurality of fragile wires which connect the chip die to the plurality of the inner lead traces, a thermoset plastic which is formed around the lead frame, inner lead traces and the chip die mounting pad in such a manner as to provide a cavity, and a thermoset molded lid which is attached to the cavity by a thermoset adhesive. The SC package alleviates the planarity problems associated with the cavity package, however, several other problems are present.

First, the thermoset plastic, the thermoset adhesive and the thermoset circuit substrate all exhibit hygroscopic properties which allow moisture to enter the cavity of the SC package and the thermoset circuit substrate. Chemical leaching is produced from the contact of the moisture with the thermoset plastic within the cavity. Leached chemicals, within the cavity, can be in contact with the plurality of fragile wires, the chip die and/or the plurality of inner lead traces. The leached chemicals can result in the shorting of the plurality of fragile wires or in the corrosion of the plurality of inner lead traces. The shorting or the corrosion can produce chip failure. High temperatures are generated within the cavity during the process of attaching the SC package to an intended device. The generated high temperatures convert moisture within the cavity and the thermoset circuit substrate to steam. The steam within the cavity expands and may result in the cracking of the thermoset molded lid and/or damage to the chip. The steam within the thermoset circuit substrate may also produce delamination internal to the circuit substrate and/or some of the inner lead traces and chip die mounting pad. The delaminated inner lead traces and/or the delaminated chip die mounting pad can result in the shorting of the delaminated inner lead traces or the loss of electrical connections between the chip die and the lead traces. The shorting of the delaminated inner lead traces and/or the loss of electrical connections produces chip failure. Second, the thermoset plastic, the thermoset adhesive and the thermoset circuit substrate all have different coefficients of thermal expansion. High temperature variations are generated during the process of attaching the SC package to an intended device. The generated high temperature variations result in the loss of mechanical adhesion, between the thermoset plastic and the thermoset circuit substrate, and between the thermoset plastic and the thermoset molded lid. The loss of mechanical adhesion results from the thermoset plastic, the thermoset circuit substrate and the thermoset molded lid all having different coefficients of thermal expansion. The loss of mechanical adhesion between the thermoset molded lid and the thermoset plastic produces a path for moisture to enter the cavity. Moisture within the cavity creates the same chemical leaching, delamination and cracking problems as discussed above with the hygroscopic properties of the SC package.

Other prior art approaches for designing a chip carrier package to provide adequate protection from the external environment include variations to the SC package without a thermoset molded lid. The variation packages utilize a sealant which completely covers the chip die, the thermoset circuit substrate and the plurality of fragile wires. Several problems exist, however, for the variation packages. First, the sealant is expensive and adds to the cost of production for the variation packages. Second, some semi-conductor devices, such as microprocessors cannot have direct contact between the chip die and the sealant.

A further attempt at designing a chip carrier package to provide adequate protection from the external environment is the ceramic cavity chip carrier package (CCC package). However, the CCC package is more expensive and has been referred to as cost prohibitive.

It would be an advantage therefore to have a homogeneous chip carrier cavity package (HC package) which utilizes the same thermoplastic for the various integral attachments to the HC package, such as, the molded lid and the circuit substrate. Since the various integral attachments are all comprised of the same thermoplastic as the HC package, a chemical bonding or fusing of the integral attachments to the HC package may be utilized to provide adequate protection from the external environment. The HC package eliminates the problems associated with having different coefficients of thermal expansion and moisture entering the cavity.

SUMMARY

The present invention relates to a homogeneous thermoplastic chip carrier package for semi-conductor integrated circuit chips. More particularly, one aspect of the present invention includes a circuit substrate which is laminated with a suitable thermoplastic to form a base which provides integral reinforcement of the circuit substrate. The circuit substrate includes a chip die mounting pad and a plurality of lead traces each of which are located so as to provide electrical isolation from each other and the chip die mounting pad. A lead frame is also provided which includes a plurality of lead members each of which is attached to a different one of the plurality of lead traces. A casing is further provided which is comprised of the suitable thermoplastic, and covers the laminated circuit substrate and the lead frame so that a cavity is formed. The casing is chemically fused to a portion of the base of the laminated circuit substrate. A lid is also provided which is comprised of the suitable thermoplastic and chemically fused to the cavity.

In another aspect, the present invention includes a circuit substrate which is laminated with a suitable thermoplastic to form a base which provides integral reinforcement of the circuit substrate. The circuit substrate includes an opening and a plurality of lead traces each of which are located so as to provide electrical isolation from each other and the opening. A heat sink is also provided which is chemically fused to the laminated circuit substrate. A lead frame is further provided which includes a plurality of lead members each of which is attached to a different one of the plurality of lead traces. A casing is also provided which is comprised of the suitable thermoplastic, and covers the laminated circuit substrate, the heat sink and the lead frame so that a cavity is formed. The casing is chemically fused to a portion of the base of the laminated circuit substrate. A lid is further provided which is comprised of the suitable thermoplastic and chemically fused to the cavity.

In yet another aspect, the present invention includes a method of manufacturing a thermoplastic chip carrier cavity package which includes the steps of laminating a circuit substrate with a suitable thermoplastic to form a base which provides integral reinforcement of the circuit substrate, and etching a defined circuit pattern on the laminated circuit substrate. The method further includes the steps of attaching a lead frame to the defined circuit pattern, and forming a casing, which is comprised of the suitable thermoplastic, to cover the laminated circuit substrate and the lead frame so that a cavity is formed. The casing is chemically bonded to a portion of the base of the laminated circuit substrate. The method also includes the step of bonding a lid chemically to the formed cavity.

BRIEF DESCRIPTION OF THE DRAWINGS

For a more complete understanding of the present invention and for further objects and advantages thereof, reference may now be had to the following description taken in conjunction with accompanying drawings, in which.

DETAILED DESCRIPTION

Figure 1:
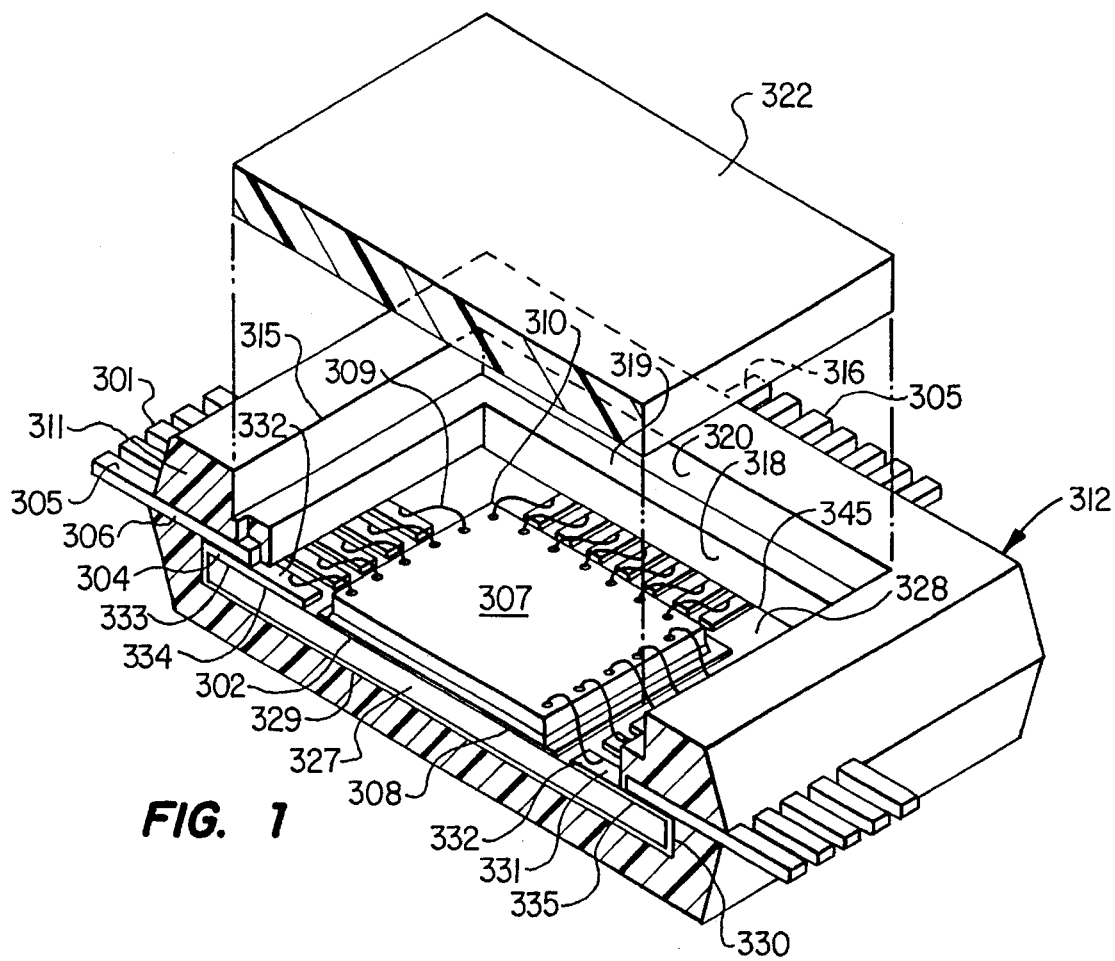
FIG. 1 is a cross-sectional, perspective view of one embodiment of a substrate cavity package constructed in accordance with the principles of the present invention.

Referring first to FIG. 1, there is shown one embodiment of a substrate cavity package which is constructed in accordance with the principles of the present invention. The substrate cavity package 312 is presented in a perspective view with a portion cross-sectioned and cut-away for purposes of illustration. The substrate cavity package 312 includes a circuit substrate 327, a metallic lead frame 301, a suitable thermoplastic 311, a cavity or recess 315 and a molded lid 322.

The term suitable thermoplastic, as utilized hereinafter, includes polyphenylene sulfide, polysulfone, polyethersulphone and polyarylsulphone.

Referring still to FIG. 1, the manufacture of the substrate cavity package 312 is accomplished by first producing the circuit substrate 327. The circuit substrate 327 is produced by utilizing a standard circuit board or printed wire board which is laminated with a suitable thermoplastic base which has an equivalent chemical composition as the suitable thermoplastic 311. The suitable thermoplastic base provides substrate material for use by electrical circuitry and integral reinforcement of the circuit board. The laminated circuit board is subjected to a process of either subtractive or additive etching. The etching process forms a defined circuit pattern which includes a circuit chip die mounting pad 302 and a plurality of adjacent electrical conductive lead traces 331. Each one of the plurality of lead traces 331 includes an inner lead trace finger 332, an outer lead trace member 333 and an intermediate lead trace portion 334. The plurality of lead traces 331 are formed during the etching process so that electrical isolation is provided between each one of the plurality of lead traces 331. During the etching process, the chip die mounting pad 302 is formed so that electrical isolation is provided between the chip die mounting pad 302 and the plurality of lead traces 331.

Still referring to FIG. 1, after the circuit substrate 327 is produced, the metallic lead frame 301 is electrically connected to it. The metallic lead frame 301 includes a plurality of adjacent electrical conductive lead members 316. Each one of the plurality of lead members 316 includes an inner lead finger 304, an outer lead member 305 and an intermediate lead portion 306. The plurality of lead members 316 are electrically connected to the plurality of lead traces 331 by utilizing an electrically conductive solder 335. The solder 335 is attached to each one of the plurality of outer lead trace members 333. The plurality of inner lead fingers 304 are placed in alignment on the plurality of outer lead trace members 333 and a thermal process is applied which melts the solder 335, thereby, resulting in the electrical connection of the plurality of inner lead fingers 304 to the plurality of outer lead trace members 333.

Referring still to FIG. 1, the circuit substrate 327 and the attached metallic lead frame 301 are placed within a molding apparatus. The molding apparatus injects the suitable thermoplastic 311 onto the circuit substrate 327 so that the circuit substrate 327 is completely covered except for, the chip die mounting pad 302, the plurality of inner lead trace fingers 332 and a portion of each one of the plurality of intermediate lead trace portions 334. The suitable thermoplastic 311 is further injected onto the lead frame 301 so that the lead frame 301 is completely covered except for the plurality of outer lead members 305. The suitable thermoplastic 311 is further injected so that the cavity 315 is formed. The cavity 315 includes a plurality of substantially vertical walls 318 each one of which includes an integral horizontal plane 319 which is located on an intermediate portion 320 of the vertical wall 318.

Still referring to FIG. 1, during the above described molding process, the suitable thermoplastic 311 is in a molten state which provides a substantial remelting of the circuit substrate's 327 suitable thermoplastic base. The remelting of the circuit substrate's 327 suitable thermoplastic base provides a superficial chemical fusing or bonding of portions of the circuit substrate 327 to the suitable thermoplastic 311 as represented at 345. The chemically fused portions of the circuit substrate 327 to the suitable thermoplastic 311 provide a moisture and chemical barrier equal to that of the suitable thermoplastic 311.

Referring still to FIG. 1, after the molding process has been completed a chip die 307 is attached to the circuit chip die mounting pad 302 by utilizing an adhesive material 308. An adhesive curing process is applied to the adhesive material 308 which results in an adhesive mechanical attachment of the chip die 307 to the chip die mounting pad 302.

After the attachment of the chip die 307, a plurality of fragile wires 309 are connected between the plurality of inner lead trace fingers 332 and a plurality of electrical connection pads 310 of the chip die 307.

An alternative to the described embodiment of FIG. 1, is the application of an encapsulation sealant over the chip die 307, the plurality of fragile wires 309, the plurality of inner lead trace fingers 332 and at least a portion of each one of the plurality of intermediate lead trace portions 334.

An additional alternative to the described embodiment of FIG. 1 is the application of an encapsulation sealant over the chip die 307, the plurality of fragile wires 309, the plurality of inner lead trace fingers 332, at least a portion of each one of the plurality of intermediate lead trace portions 334 and at least a portion of each one of the plurality of substantially vertical walls 318.

Still referring to FIG. 1, after the plurality of fragile wires 309 have been connected, the molded lid 322 is attached to the substrate cavity package 312. The molded lid 322 includes a suitable thermoplastic which has an equivalent chemical composition as the circuit substrate's 327 suitable thermoplastic base and as the suitable thermoplastic 311. The molded lid 322 is placed onto the plurality of integral horizontal planes 319 and a thermal attachment of the molded lid 322 is provided by utilizing a suitable thermal process. A suitable thermal process includes ultrasonic welding, vibration welding, spin welding and focused infrared welding. During the thermal process, a portion of the molded lid 322, which is in contact with each one of the plurality of integral horizontal planes 319, is elevated in temperature to allow the thermoplastic of the molded lid 322 and of the plurality of integral horizontal planes 319 to become molten or fluid. The molten thermoplastic of the plurality of integral horizontal planes 319 and of the molten thermoplastic of the molded lid 322 chemically intermix, thereby, providing a superficial chemical fusing or bonding of the portion of the molded lid 322 to the plurality of integral horizontal planes 319. The chemical bonding provides a moisture and chemical barrier equal to that of the suitable thermoplastic 311.

An additional embodiment of FIG. 1, includes the use of a multi-layer type laminated thermoplastic circuit substrate.

Figure 2:
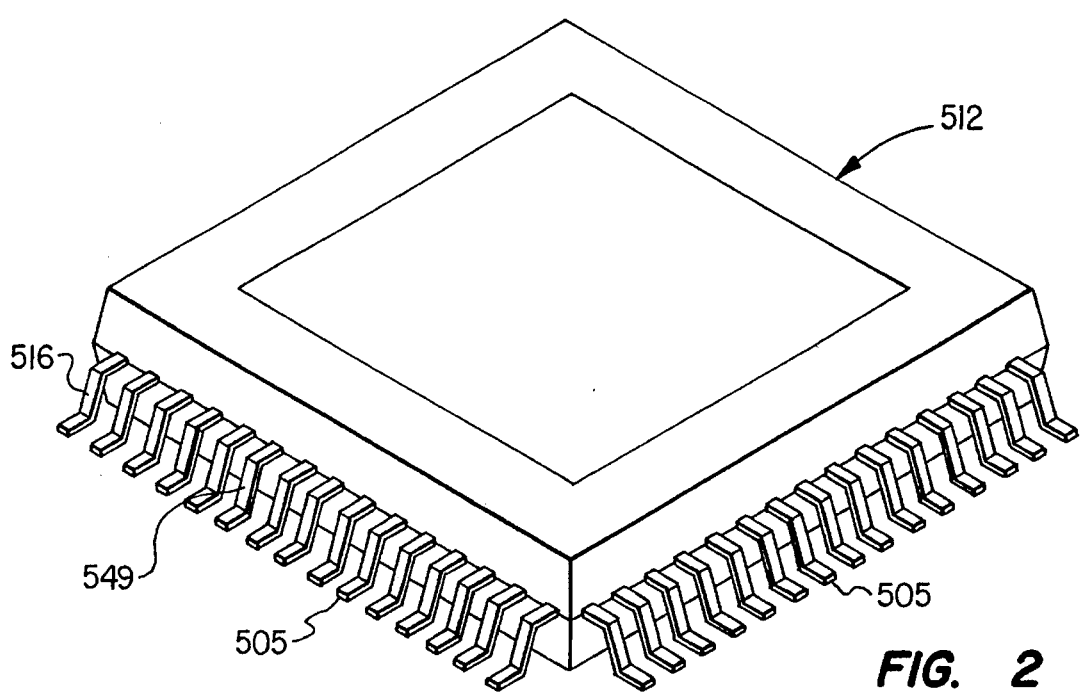
FIG. 2 is a perspective view of the complete substrate cavity package of FIG. 1.

Referring now to FIG. 2, there is shown the complete substrate cavity package of FIG. 1. The substrate cavity package 512 (SC package) is presented in a perspective view. The SC package 512 includes a plurality of lead members 516 each of which includes an outer lead end 505. Each outer lead end 505 is formed in a configuration 549 which allows final attachment of the SC package 512 to an intended device.

Figure 3:
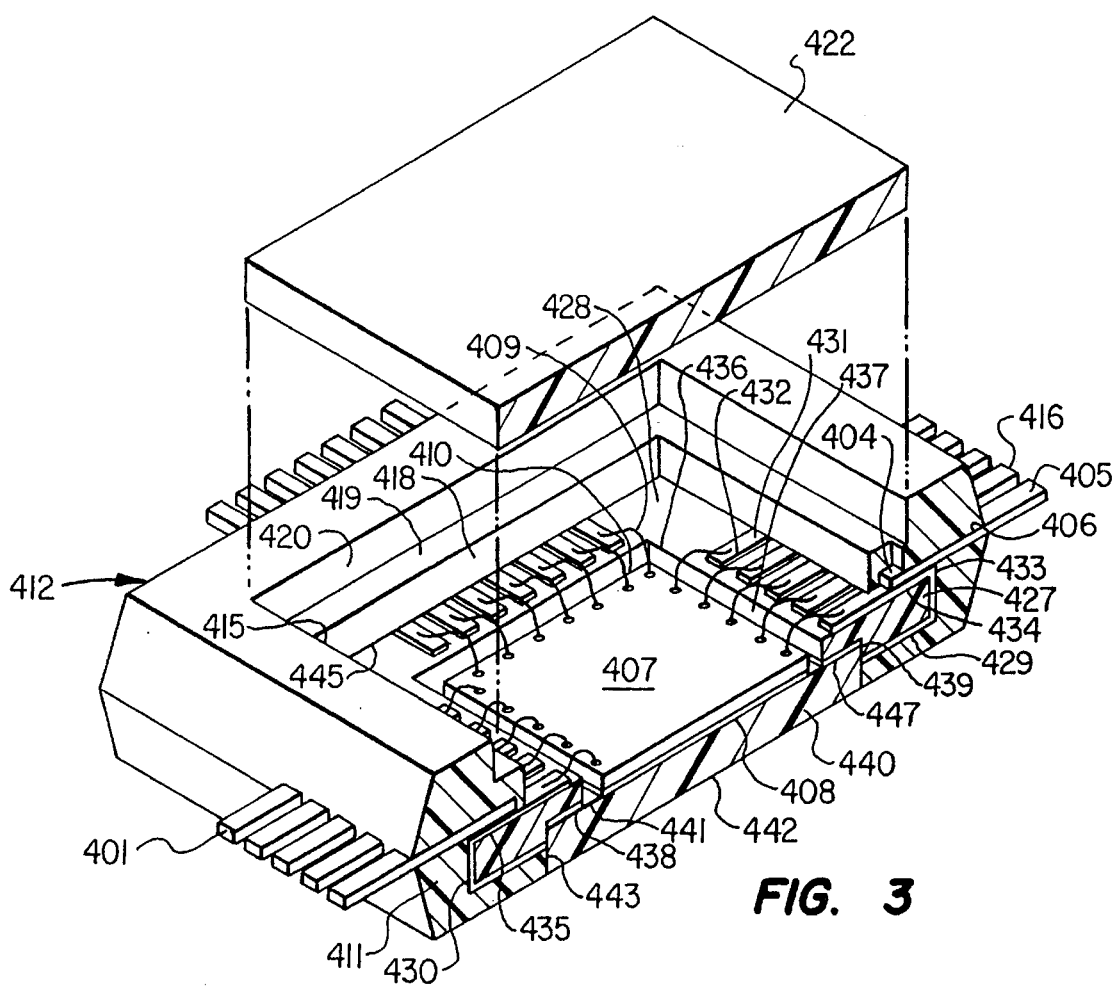
FIG. 3 is a cross-sectional, perspective view of an alternative embodiment of a substrate cavity package which is constructed with a heat sink in accordance with the principles of the present invention.

Referring now to FIG. 3, there is shown an alternative embodiment of a substrate cavity package (HS package) which is constructed with a heat sink in accordance with the principles of the present invention. The HS package 412 is presented in a perspective view with a portion cross-sectioned and cut-away for purposes of illustration. The HS package 412 generally includes a circuit substrate 427, a metallic lead frame 401, a suitable thermoplastic 411, a cavity or recess 415, a molded lid 422 and a metallic thermal heat sink or spreader 440.

Referring still to FIG. 3, the manufacture of the HS package 412 is accomplished by first producing the circuit substrate 427. The circuit substrate 427 is produced by utilizing a standard circuit board or printed wire board with a cavity or recess which is capable of receiving the metallic thermal heat sink 440. The circuit board is laminated with a suitable thermoplastic base which has an equivalent chemical composition as the suitable thermoplastic 411. The suitable thermoplastic base provides substrate material for use by electrical circuitry and integral reinforcement of the circuit board. The laminated circuit board is subjected to a process of either subtractive or additive etching. The etching process forms a defined circuit pattern which includes a plurality of adjacent electrical conductive lead traces 431. Each one of the plurality of lead traces 431 includes an inner lead trace finger 432, an outer lead trace member 433 and an intermediate lead trace portion 434. The plurality of lead traces 431 are formed during the etching process so that electrical isolation is provided between each one of the plurality of lead traces 431.

Referring still to FIG. 3, after the circuit substrate 427 is produced, the metallic thermal heat sink (Heat sink) 440 is attached to the circuit substrate 427. The heat sink 440 includes a top side 441, a side opposite the top side 442 and sides 443 which are located between and connecting the top side 441 and the side opposite the top side 442. The heat sink 440 further includes a chip die mounting pad 402. The heat sink 440 is chemically attached to the circuit substrate 427 by utilizing suitable thermoplastic 447 which has an equivalent chemical composition as the circuit substrate's 427 suitable thermoplastic base. The suitable thermoplastic 447 is placed between the side opposite the top side 429, of the circuit substrate 427, and a portion of the top side 441 of the heat sink 440. A thermal process is applied to the suitable thermoplastic 447 resulting in a superficial chemical fusing or bonding of the circuit substrate's 427 suitable thermoplastic base and the suitable thermoplastic material 447, thus, providing a chemical attachment. The chemically fused attachment provides a moisture and chemical barrier equal to that of the suitable thermoplastic 411.

Still referring to FIG. 3, after the circuit substrate 427 is produced, the metallic lead frame 401 is electrically connected to it. The metallic lead frame 401 includes a plurality of adjacent electrical conductive lead members 416. Each one of the plurality of lead members 416 includes an inner lead finger 404, an outer lead member 405 and an intermediate lead portion 406. The plurality of lead members 416 are electrically connected to the plurality of lead traces 431 by utilizing an electrically conductive solder 435. The solder 435 is attached to each one of the plurality of outer lead trace members 433. The plurality of inner lead fingers 404 are placed in alignment on the plurality of outer lead trace members 433 and a thermal process is applied which melts the solder 435, thereby, resulting in the electrical connection of the plurality of inner lead fingers 404 to the plurality of outer lead trace members 433.

Referring still to FIG. 3, the circuit substrate 427, the attached metallic lead frame 401 and the attached heat sink 440 are placed within a molding apparatus. The molding apparatus injects the suitable thermoplastic 411 onto the circuit substrate 427 so that it totally encases the side opposite the top side 429 and the sides 430, and so that it partially covers a portion of the top side 428. The suitable thermoplastic 411 is further injected onto a portion of each one of the plurality of intermediate lead trace portions 434, the plurality of inner lead fingers 404 and a portion of each one of the plurality of intermediate lead portions 406. The suitable thermoplastic is further injected so that the cavity 415 is formed. The cavity includes a plurality of substantially vertical walls 418 with each one having an integral horizontal plane 419 which is located on an intermediate portion 420 of the vertical wall 418.

Still referring to FIG. 3, during the above described molding process, the suitable thermoplastic 411 is in a molten state which provides a substantial remelting of the circuit substrate's 427 suitable thermoplastic base. The remelting of the circuit substrate's 427 suitable thermoplastic base provides a superficial chemical fusing or bonding of portions of the circuit substrate 427 to the suitable thermoplastic 411, as represented at 445. The chemically fused portions of the circuit substrate 427 to the suitable thermoplastic 411 provide a moisture and chemical barrier equal to that of the suitable thermoplastic 411.

Referring still to FIG. 3, after the molding process has been completed, a chip die 407 is attached to the circuit chip die mounting pad 402 by utilizing an adhesive material 408. An adhesive curing process is applied to the adhesive material 408 which results in an adhesive mechanical attachment of the chip die 407 to the chip die mounting pad 402.

After the attachment of the chip die 407, a plurality of fragile wires 409 are connected between the plurality of inner lead trace fingers 432 and a plurality of electrical connection pads 410 of the chip die 307.

An alternative to the described embodiment of FIG. 3, is the application of an encapsulation sealant over the chip die 407, the plurality of fragile wires 409, the plurality of inner lead trace fingers 432 and at least a portion of each one of the plurality of intermediate lead trace portions 434.

An additional alternative to the described embodiment of FIG. 3 is the application of an encapsulation sealant over the chip die 407, the plurality of fragile wires 409, the plurality of inner lead trace fingers 432, at least a portion of each one of the plurality of intermediate lead trace portions 434 and at least a portion of each one of the plurality of substantially vertical walls 418.

Still referring to FIG. 3, after the plurality of fragile wires 409 have been connected, the molded lid 422 is attached to the substrate cavity package 412. The molded lid 422 includes a suitable thermoplastic which has an equivalent chemical composition as the circuit substrate's 427 suitable thermoplastic base and as the suitable thermoplastic 411. The molded lid 422 is placed onto the plurality of integral horizontal planes 419 and a thermal attachment of the molded lid 422 is provided by utilizing a suitable thermal process. A suitable thermal process includes ultrasonic welding, vibration welding, spin welding and focused infrared welding. During the thermal process, a portion of the molded lid 422, which is in contact with the each one of the plurality of integral horizontal planes 419, is elevated in temperature to allow the thermoplastic of the molded lid 422 and of the plurality of integral horizontal planes 419 to become molten or fluid. The molten thermoplastic of the molded lid 422 and of the integral horizontal planes 419 chemically intermix, thereby, providing a superficial chemical fusing or bonding of the portion of the molded lid 422 to the plurality of integral horizontal planes 419. The chemical bonding provides a moisture and chemical barrier equal to that of the suitable thermoplastic 411.

An additional embodiment of FIG. 3 includes the use of a multi-layer type laminated thermoplastic circuit substrate.

Figure 4:
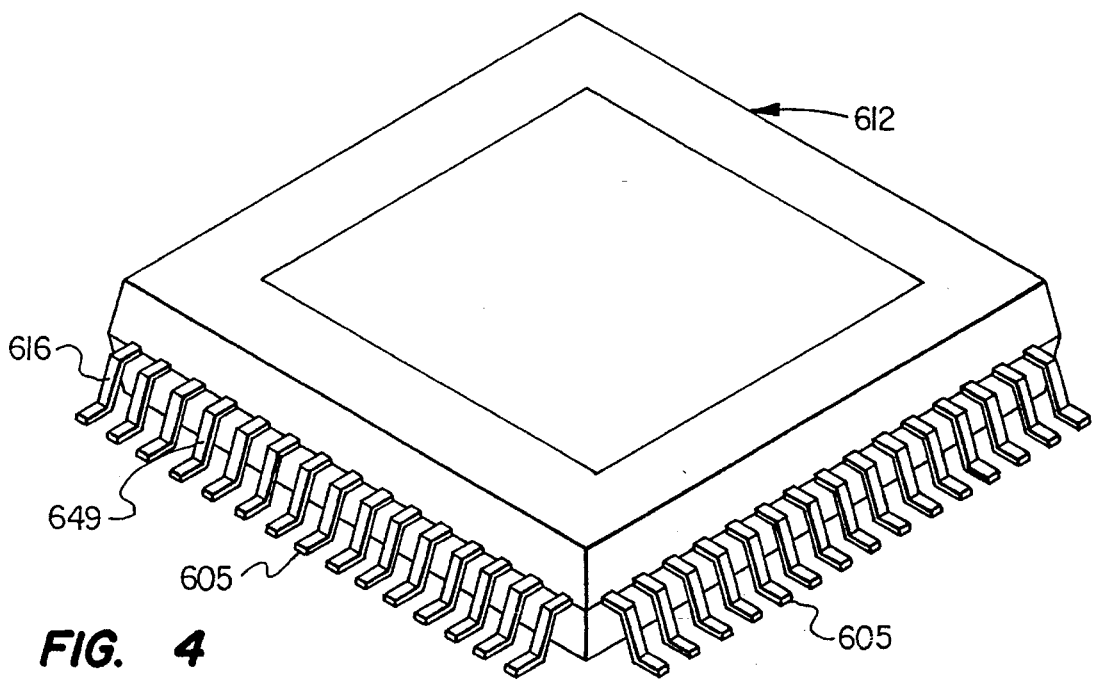
FIG. 4 is a perspective view of the complete substrate cavity package of FIG. 3.

Referring now to FIG. 4, there is shown the complete substrate cavity package of FIG. 3. The substrate cavity package 612 (HS cavity package) is presented in a perspective view. The HS cavity package 612 includes a plurality of lead members 616 each of which includes an outer lead end 605. Each outer lead end 605 is formed in a configuration 649 which allows final attachment of the HS cavity package 612 to an intended device.

While it is believed that the operation and construction of the system of the present invention will be apparent from the foregoing description, the method of operation and structure of the system shown and described has been characterized as being preferred and obvious changes and modifications may be made therein without departing from the spirit and scope of the invention as defined in the following claims.

What is claimed is:

1. A method of manufacturing a thermoplastic chip carrier cavity package, said method comprising the steps of:

laminating a circuit substrate with a suitable thermoplastic in order to form a base, said base providing integral reinforcement of said circuit substrate;

etching a defined circuit pattern on said laminated circuit substrate;

attaching a lead frame to said defined circuit pattern;

forming a casing, which is comprised of said suitable thermoplastic, to cover said laminated circuit substrate and said lead frame so that a cavity is formed, said casing being chemically bonded to a portion of said base of said laminated circuit substrate; and bonding a lid chemically to said casing to cover to said formed cavity.

2. The method of claim 1 wherein said step of etching includes subtractive etching.

3. The method of claim 1 wherein said step of etching includes additive etching.

4. The method of claim 1 wherein said step of forming a casing includes injecting or molding.

5. The method of claim 1 wherein said step of attaching a lead frame includes attaching said lead frame to said plurality of traces with a electrically conductive solder.

6. The method of claim 1 wherein said step of forming a casing includes a remelting of said base so that said casing is chemically fused to a portion of said base.

\* \* \* \* \*